US008377729B2

(12) United States Patent
Kahen et al.

(10) Patent No.: US 8,377,729 B2
(45) Date of Patent: Feb. 19, 2013

(54) FORMING II-VI CORE-SHELL SEMICONDUCTOR NANOWIRES

(75) Inventors: Keith B. Kahen, Rochester, NY (US); Matthew Holland, Victor, NY (US)

(73) Assignee: Eastman Kodak Company, Rochester, NY (US)

( * ) Notice: Subject to any disclaimer, the term of this patent is extended or adjusted under 35 U.S.C. 154(b) by 511 days.

(21) Appl. No.: 12/689,326

(22) Filed: Jan. 19, 2010

(65) Prior Publication Data

US 2011/0177683 A1  Jul. 21, 2011

(51) Int. Cl.
*H01L 21/00* (2006.01)
*H01L 21/20* (2006.01)

(52) U.S. Cl. .................. 438/47; 438/509; 257/E21.462

(58) Field of Classification Search .............. 438/47, 438/509; 257/E21.462, E21.466; 977/762
See application file for complete search history.

(56) References Cited

U.S. PATENT DOCUMENTS

| | | | | |
|---|---|---|---|---|
| 6,225,198 | B1 * | 5/2001 | Alivisatos et al. | 438/497 |
| 6,306,736 | B1 * | 10/2001 | Alivisatos et al. | 438/497 |
| 2002/0175408 | A1 | 11/2002 | Majumdar et al. | |
| 2005/0054004 | A1 | 3/2005 | Alivisatos et al. | |
| 2006/0019472 | A1 * | 1/2006 | Pan et al. | 438/486 |
| 2008/0280069 | A1 * | 11/2008 | Parce et al. | 427/580 |
| 2010/0001209 | A1 * | 1/2010 | Osinski et al. | 250/459.1 |

FOREIGN PATENT DOCUMENTS

| | | | |
|---|---|---|---|
| EP | 1 700 935 A1 | 9/2006 | |
| KR | 2009 0003840 A | 1/2009 | |
| WO | WO 2006/016914 A2 | 2/2006 | |
| WO | WO 2008/140611 A2 | 11/2008 | |

OTHER PUBLICATIONS

Thapa et al, Synthesis of cubic aluminum nitride by VLS technique using gold chloride as a catalyst and its optical and field emission properties, Journal of Alloys and Compounds, (2008).

Lee et al, High-brightness gallium nitride nanowire UV blue light emitting diodes, Philosophical Magazine, vol. 87, Nos. 14-15, 2105-2115, May 2007.

Tang et al, Organic electroluminescent diodes, Appl. Phys. Lett 51 (12) Sep. 1987, 913-915.

Krames et al, Status and Future of High-Power Light-Emitting Diodes for Solid-State Lighting, Jour. of Display Technology, vol. 3, No. 3, Jun. 2007, pp. 160-175.

Haranath et al, Enhanced luminescence of $Y_3Al_5O_{12}:Ce^{3+}$ nanophosphor for white light-emitting diodes, Appl. Physics. Lett 89, 173118 (2006).

Lee et al, Nitride-Based Green Light-Emitting Diodes With Various p-Type Layers, Journal of Display Technologies, vol. 1, No. 2, Jun. 2007, pp. 126-132.

Zubia et al, Nanoheteroepitaxy: The Application of nanostructuring and substrate compliance to the heteroepitaxy of mismatched semi-conductor materials, Journal of Appl. Physics, vol. 85, No. 9, May 1999, pp. 6492-6496.

(Continued)

*Primary Examiner* — Lex Malsawma
(74) *Attorney, Agent, or Firm* — Raymond L. Owens

(57) ABSTRACT

A method of making II-VI core-shell semiconductor nanowires includes providing a support; depositing a layer including metal alloy nanoparticles on the support; and heating the support and growing II-VI core semiconductor nanowires where the metal alloy nanoparticles act as catalysts and selectively cause localized growth of the core nanowires. The method further includes modifying the growth conditions and shelling the core nanowires to form II-VI core-shell semiconductor nanowires.

30 Claims, 9 Drawing Sheets

OTHER PUBLICATIONS

Hersee et al, The Controlled Growth of GaN Nanowires, Nano Letters, V. 6, No. 8, 2006, 1808-1811.

Barrelet et al, Synthesis of CdS and ZnS Nanowires Using Single-Source Molecular Precursors, J. Am. Chem. Soc. 2003 125, 11498-11499.

Salfi, et al Electrical properties of Ohmic contacts to ZnSe nanowires and their application to nanowire-based photodetection, Applied Phys. Lett. 89, 261112 (2006).

Zhang et al, Luminance of ZnSe nanowires grown by metalorganic vapor phase deposition under different pressures, Journal of Appl. Physics, V. 95, No. 10, 2004, pp. 5752-5755.

Phillpose et al, Enhancement of band edge luminescence in ZnSe nanowires, Journal of Applied Physics, 100, 084316 (2006).

Ohno et al, Fe-catalytic growth of ZnSe nanowires on a ZnSe(001) surface at low temperatures by molecular-beam epitaxy, Applied Physics Lett. 87, 043105 (2005).

Colli et al, Low-temperature synthesis of ZnSe nanowires, and nanosaws by catalyst-assisted molecular-beam display, Applied Physics Lett. 86, 153103 (2005).

Hersee et al, GaN nanowire light emitting diodes based on templated and scalable nanowire growth process, Electronic Letters, Jan. 2009, vol. 45, No. 1 pp. 75-76.

Pradhan et al, Efficient and Color Tunable Mn-Doped ZnSe Nanocrystal Emitters: Control of Optical Performance via Greener Synthetic Chemistry, J. Am. Chem. Soc. 129, 2007, 3339-3347.

* cited by examiner

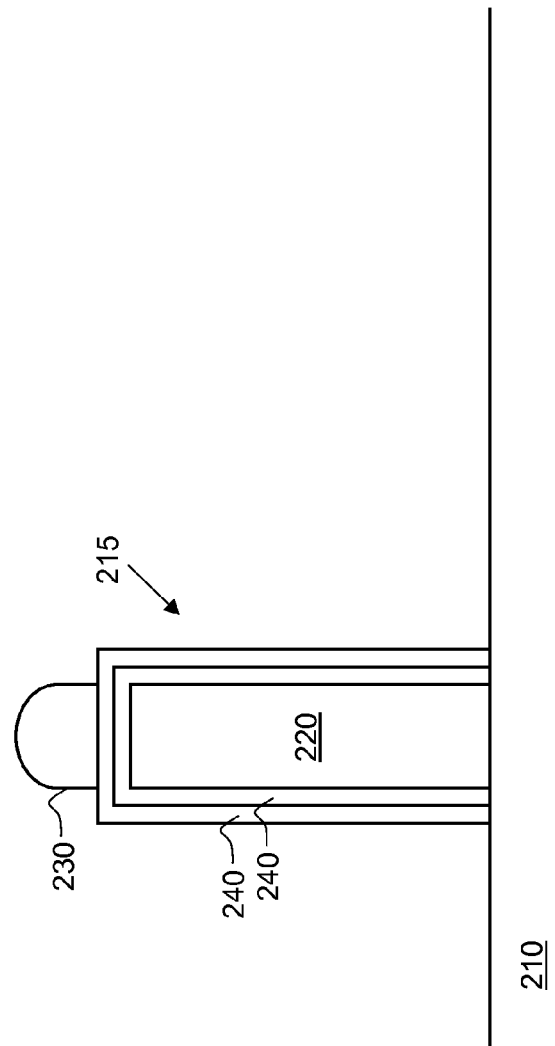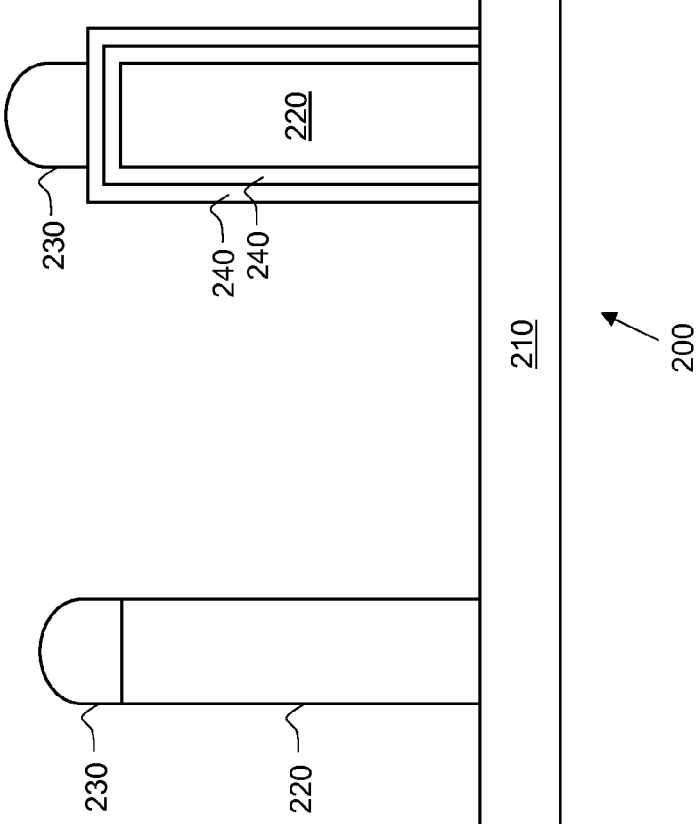

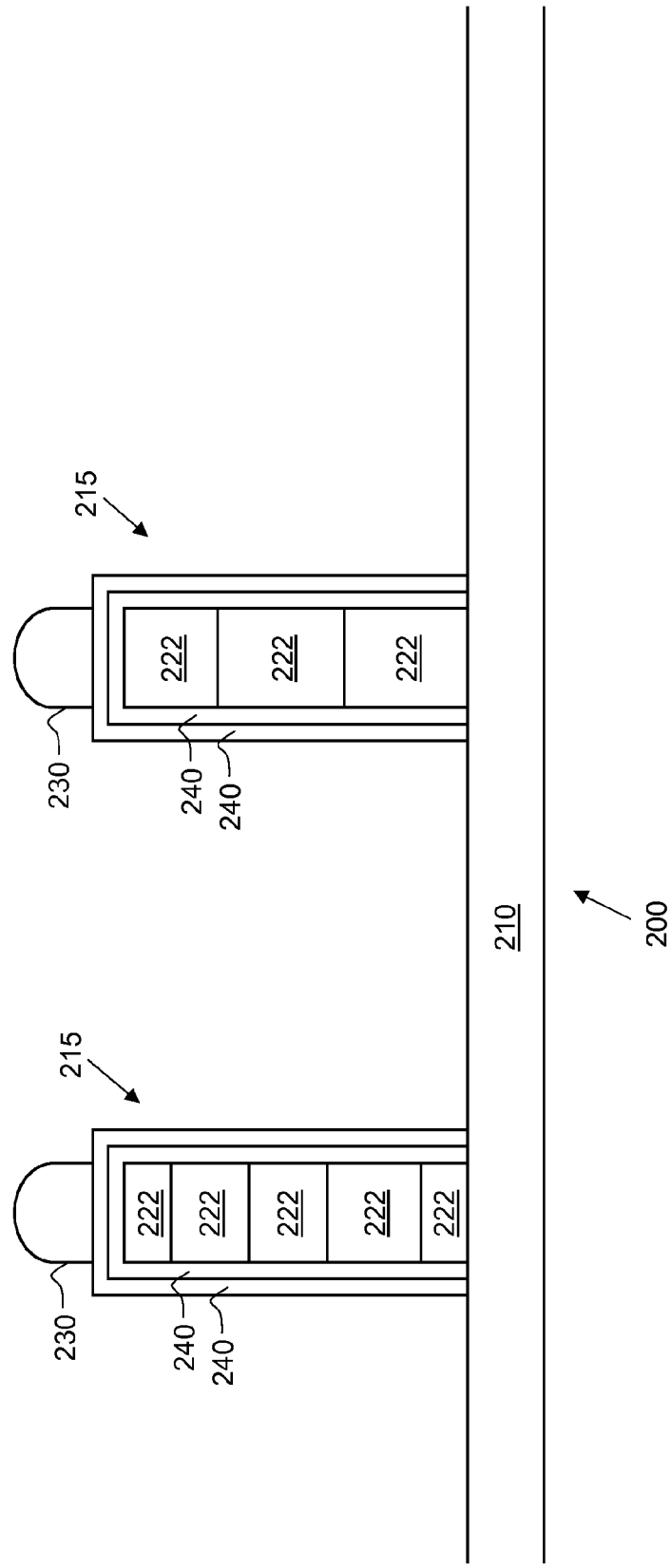

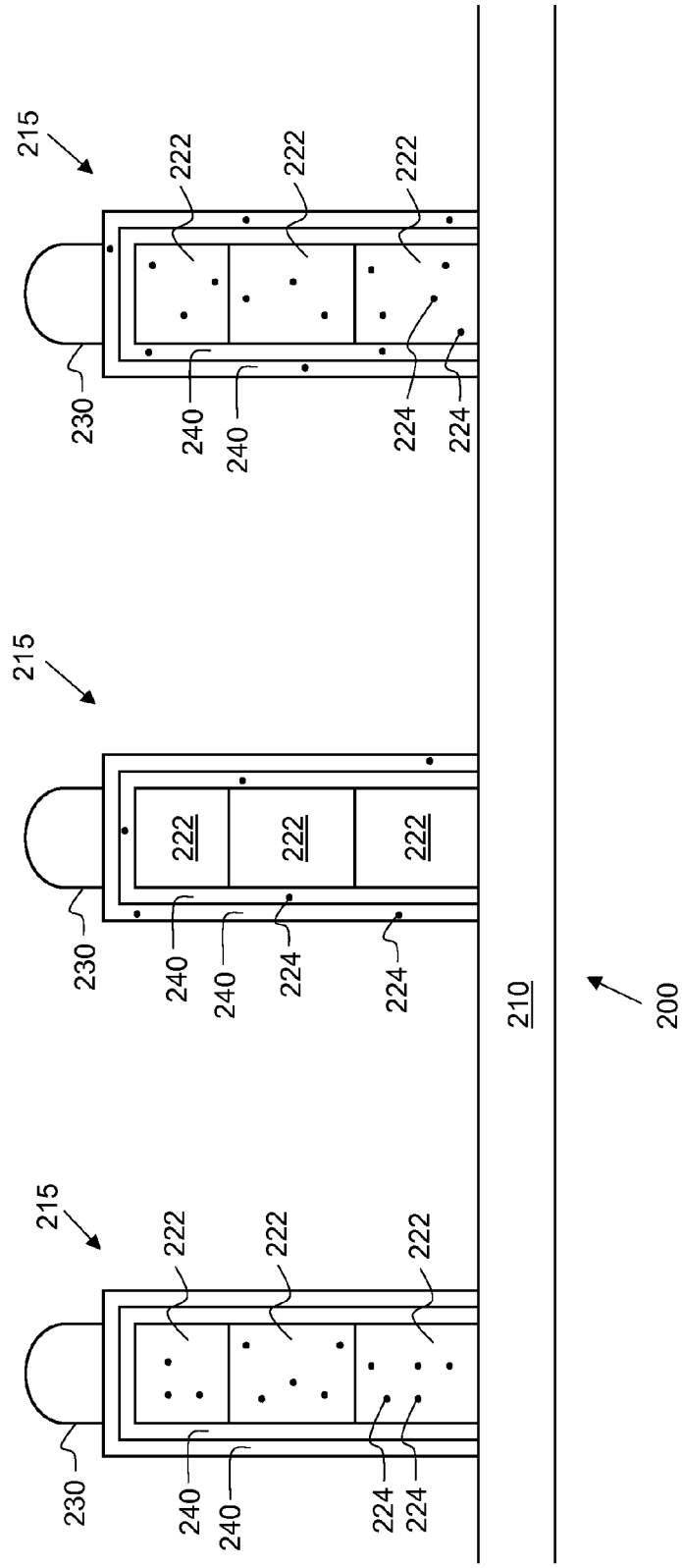

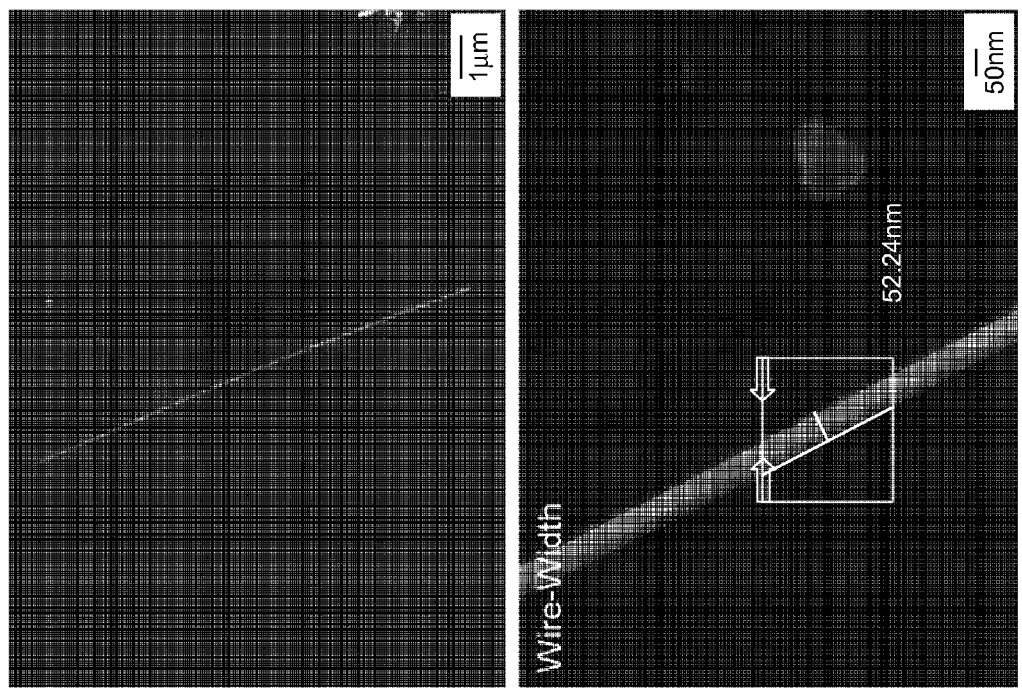
*FIG. 7a*  *FIG. 7b*

FORMING II-VI CORE-SHELL SEMICONDUCTOR NANOWIRES

CROSS-REFERENCE TO RELATED APPLICATION

Reference is made to commonly assigned U.S. patent application Ser. No. 12/689,310 filed Jan. 19, 2010, now U.S. Pat. No. 8,212,236, entitled "II-VI Core-Shell Semiconductor Nanowires, by Keith B. Kahen et al, the disclosure of which is incorporated herein.

FIELD OF THE INVENTION

The present invention relates to forming low defect II-VI core-shell semiconductor nanowires.

BACKGROUND OF THE INVENTION

Worldwide interest in light-emitting diode (LED) technology has rapidly increased over the past two decades. Starting with inorganic LEDs developed in the 60s, they have found their way into numerous lighting, signaling, and display applications, such as, automotive lighting, architectural lighting, flashlights, and backlights for LCD-based displays. Since the turn of the century they have started to appear in more mainstream lighting applications, which as a result of their long life and very high efficacy will result in significant savings in energy usage. This set of applications include traffic signaling lights, street lights, and most recently, residential lighting.

Organic-based LEDs (OLED) were developed in the late 70s (Tang et al, Appl. Phys. Lett. 51, 913 (1987)) and have just recently begun to appear in commercial display applications, such as, televisions, picture frames, and digital camera displays. In the last 5 years or so, good progress has also been made to make OLEDs a viable option for general lighting applications. Despite large gains in their efficiency, OLED lighting will likely remain a niche application due to their environmental sensitivity, shorter lifetime, and low output power density. The latter issue is the dominant one since it requires OLED lighting products to have large surface areas in order to produce acceptable amounts of lumens.

In spite of the deepening penetration of inorganic LEDs into mainstream lighting, unresolved issues still remain, such as, high cost, poor color, and sub-desirable efficiency. Overall there are two ways for creating white LEDs (M. Krames et al., J. Display Technol. 3, 160 (2007)), combining blue, green, and red LEDs to form white LED arrays or combining a blue LED with appropriate down conversion phosphors to create a white light source. The first way yields a higher overall efficiency. Despite very high internal quantum efficiencies for red and blue LEDs of approximately 90% and 70%, respectively, the IQE of green LEDs at the desirable wavelengths of 540-560 nm is below 10%. This "green gap" issue has been recognized for many years (large strain develops in the active region as a result of incorporating sufficient In in the GaN in order to form green emitting InGaN) and despite numerous efforts, still remains largely unresolved. Combining blue GaN LEDs with appropriate phosphors has recently yielded white LEDs with efficacies over 120 Lumens/Watt. Unfortunately, the correlated color temperature (CCT) of the corresponding white is typically high (>6000 K), yielding a cold light which lacks sufficient red response. Another outstanding issue is the efficiency of the phosphors, which for commercial phosphors are currently at 65% (include the efficiency hit due to the Stoke shift) (D. Haranath et al., Appl. Phys. Lett. 89, 173118 (2006)). Both inorganic LED approaches for white light, as of today, are approximately a factor of 100 too costly to engender significant market penetration into the residential market without significant government subsidies or incentives.

As discussed above, despite the impressive efficiency and large penetration to date of inorganic LEDs (to be called LEDs) into lighting applications, outstanding issues still remain. Focusing on color-mixed LEDs (combining red, green, and blue LEDs), the two pressing issues are high cost and the sub-par performance of green LEDs. A large part of the high cost is associated with conventional LEDs being grown on crystalline substrates. More specifically, sapphire or SiC for blue and green LEDs and GaAs for red LEDs. As discussed above, the sticking point associated with creating efficient InGaN-based LEDs is that incorporating In into the active region results in significant strain relative to the cladding layers (W. Lee et al., J. Display Technol. 3, 126 (2007)).

Recently, there has been significant research activity towards creating nanowire-based LEDs, where the nanowires are grown using MOVPE techniques by either a template (S. Hersee et al., Electron. Lett. 45, 75 (2009)) or vapor liquid solid (VLS) approach (S. Lee et al. Philosophical Magazine 87, 2105 (2007)). The advantages of employing nanowires as LED elements are that they can be grown on inexpensive substrates (such as glass) and the amount of lattice mismatch that can be tolerated between LED layers is significantly higher when the crystalline material is a 20-100 nm thick nanowire as compared to bulk heterostructure growth (D. Zubia et al., J. Appl. Phys. 85, 6492 (1999)). Green LEDs can be formed by two ways, incorporating InGaN emissive layers in GaN-based pin nanowires, or by forming II-VI material based pin nanowires. Progress has been made on both fronts, but many issues still remain unresolved. For GaN-based nanowires, efficient doping is still problematic and the quantum efficiency of the emitters remains sub-par (S. Hersee et al., Nano Lett. 6, 1808 (2006)). For II-VI material based pin nanowires, green LEDs can be formed by employing CdZnSe or ZnSeTe in the active region; however, the number of unresolved issues is even larger.

Progress in creating highly emissive (C. Barrelet et al., JACS 125, 11498 (2003)) and dopable II-VI nanowires has been limited. Almost no mention has been made of successful doping of II-VI nanowires, or where doping has been mentioned it is stated that the undoped ZnSe nanowires have low resistivity, ~1 ohm-cm (J. Salfi et al. Appl. Phys. Lett. 89, 261112 (2006)), which implies a high degree of defects since undoped ZnSe should be highly resistive (>$10^5$ ohm-cm). With regard to emissive characteristics, the photoluminescence (PL) of high quality epi-material should show band gap exciton features and a very small amount of mid-gap defect emission. All reported ZnSe nanowires show large levels of defect emission in their PL response (X. Zhang et al., J. Appl. Phys. 95, 5752 (2004)). The one article (U. Philipose et al., J. Appl. Phys. 100, 084316 (2006)) in which the defect emission was reduced was where added Zn was post-growth diffused into the ZnSe nanowires in order to reduce the large amount of Zn vacancies present after nanowire growth. Performing an extra diffusion step is costly and unworkable when the emitter layer is part of a pin diode device structure. Consequently, in spite of the technological importance of device quality II-VI nanowires, problems remain.

SUMMARY OF THE INVENTION

In accordance with the present invention, II-VI core-shell semiconductor nanowires are formed by a method comprising:

(a) providing a support;
(b) depositing a layer including metal alloy nanoparticles on the support;
(c) heating the support and growing II-VI core semiconductor nanowires where the metal alloy nanoparticles act as catalysts and selectively cause localized growth of the core nanowires; and
(d) modifying the growth conditions and shelling the core nanowires to form II-VI core-shell semiconductor nanowires.

The present invention employs metal alloy catalyst in the VLS growth of II-VI core-shell semiconductor nanowires. The result is the formation of high quality nanowires, which contain few unwanted native defects. In comparison with conventional II-VI semiconductor nanowires grown using gold catalysts, the undoped nanowires are intrinsic, doped nanowires can be controllably formed using conventional substitutional elements, the quantum efficiency of the nanowires is high, the emission spectra are free of unwanted defect emissions, and there is enhanced transport of the electrons and holes in the core region of the nanowires It is an advantage of the present invention to enable the formation of high quality II-VI core-shell semiconductor nanowires which contain few unwanted native defects. By employing gold-tin alloys as the metal catalysts in the VLS growth of II-VI core-shell semiconductor nanowires, the catalysts have a much reduced melting point which enables the growth temperature of the II-VI core semiconductor nanowires to be lowered to the low 300° C. range. Conventional VLS growth of II-VI semiconductor nanowires using gold catalyst typically involves growth temperatures in the 550° C. range. As is well known in the art, the desired growth temperature for crystalline II-VI semiconductor is in the high 200° C. to low 300° C. temperature range. In this temperature range the number of unwanted native defects is minimized. To turn off the selective localized growth of the nanowires and begin the formation of high quality crystalline shell(s) surrounding the core nanowires, the growth conditions need to be modified. Two approaches are increasing the growth rate by adjusting the precursor flow rates while maintaining the growth temperature in the low 300° C. range; and, the other is increasing the growth temperature to the upper 300° C. range, while maintaining the core precursor flow rates. Combining metal alloy catalysts with the shelling of the core nanowires, results in the formation of the high quality II-VI nanowires. Overall the II-VI core-shell semiconductor nanowires are desirable elements in numerous optoelectronic, electronic, and optical applications, such as, LEDs, lasers, rectifiers, solar cells, transistors, or phosphors.

BRIEF DESCRIPTION OF THE DRAWINGS

FIGS. 2a and 2b show a schematic of a II-VI core-shell semiconductor nanowire wherein attached at the free end is a metal alloy nanoparticle;
FIG. 3 shows a schematic of a II-VI core-shell semiconductor nanowire which includes discrete heterostructure units;
FIG. 4 shows a schematic of a II-VI core-shell semiconductor nanowire which includes doped discrete heterostructure units;
FIGS. 7a and 7b show scanning electron microscope images of ZnSe:Cl/ZnSeS core-shell nanowires.

DETAILED DESCRIPTION OF THE INVENTION

It is desirable to form semiconductor optoelectronic and electronic devices that not only have good performance, but also are low cost and can be deposited on arbitrary substrates. Using II-VI semiconductor nanowires as the building blocks for semiconductor devices would result in optoelectronic and electronic devices that confer these advantages. As is well known in the art, semiconductor nanowires can be grown by both colloidal and vapor-based VLS processes. The colloidal processes have some advantages with respect to cost, however, at this time, it is difficult to custom tailor their composition. Vapor-based VLS techniques have been performed using either molecular beam epitaxy (MBE) or metal-organic vapor phase epitaxy (MOVPE). The MBE technique can result in very high quality semiconductors being formed, however, it is a very expensive growth technique and as a result is limited to research scale investigations. MOVPE is currently being used worldwide to form commercial high quality III-V LEDs and lasers. As a result, the focus below will be on II-VI semiconductor nanowires grown by VLS techniques using MOVPE equipment.

Figure 1:
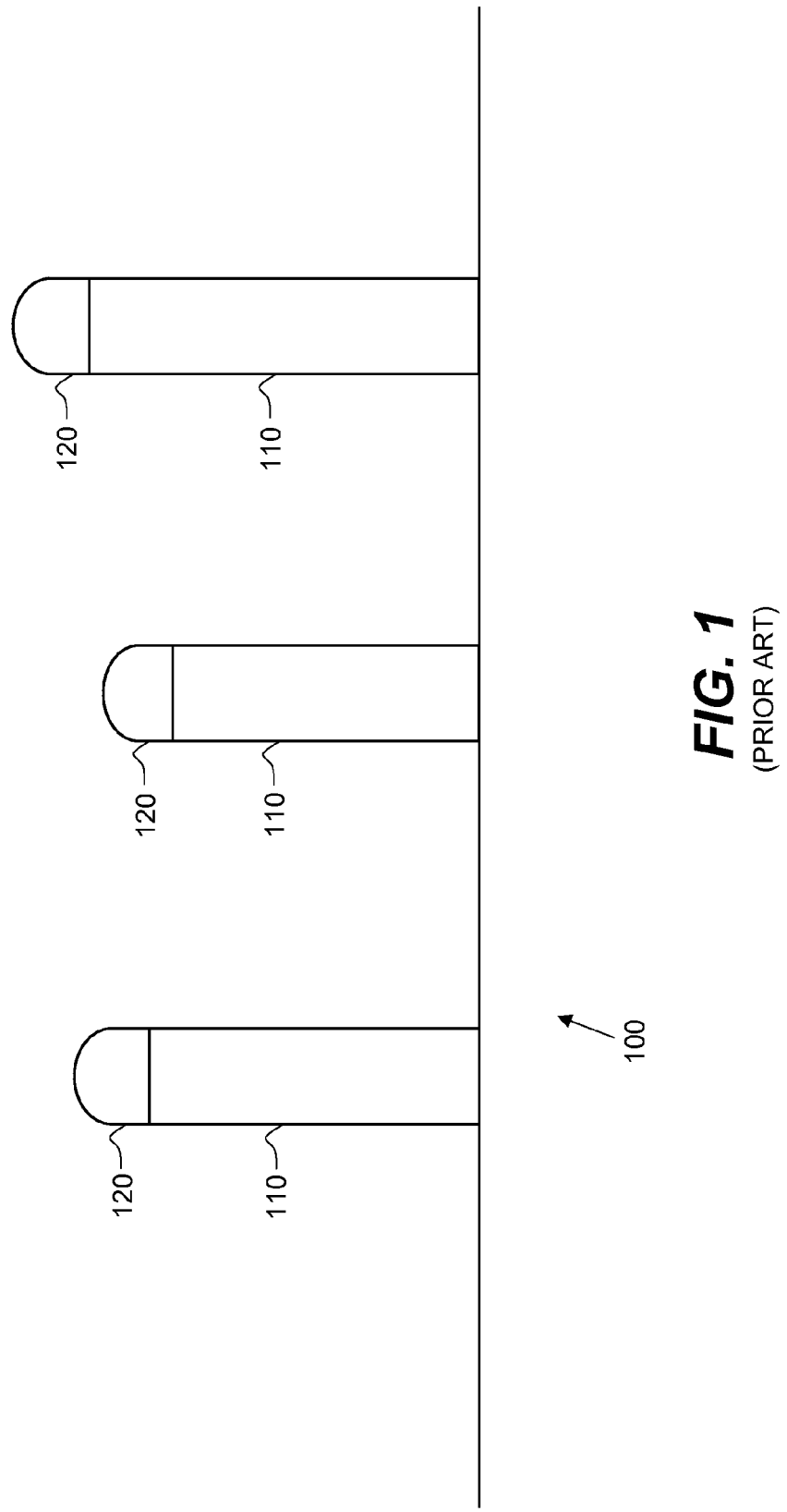
FIG. 1 shows a schematic of a prior art II-VI semiconductor nanowire.

A prior art II-VI semiconductor nanowire is shown in FIG. 1. In the figure, the substrate is 100, the semiconductor nanowire is 110, and the metal nanoparticle is 120. As is well known in the art, the typical metal nanoparticle 120 is composed of gold. However, others have also used metals, such as, Ag, Ni, and Ti. In addition, gold compounds have also been used as catalyst, such as, $AuCl_3$ (R. Thapa et al., J. Alloys and Compounds 475, 373 (2008)). To begin a growth sequence the metal nanoparticles 120 need to be distributed on the substrate 100 surface. Well known techniques for forming a distribution of metal nanoparticles 120 on the substrate 100 are drop or spin casting a dispersion of metallic nanoparticles 120, and depositing a thin metal (by sputtering or thermal evaporation) on the substrate surface. With regard to the latter procedure, very thin metal layers (<5 nm) typically deposit in discrete nano-islands instead of continuous films. Sometimes the substrates containing the thin metal deposits are heated in order to aid in the formation of metal nanoparticles 120 having particular sizes. Following the formation of the metal nanoparticles 120, MOVPE deposition of the semiconductor nanowires 110 occurs at the growth temperature. The growth temperature is typically chosen such that the metal nanoparticles 120 or catalysts are molten at that temperature. Semiconductor nanowires can be formed using MOVPE via a VSS (vapor solid solid) process; however, it has been found that the quality of nanowires is inferior to that formed when the catalyst are liquid during the growth step. Using gold as the catalyst and taking into account the reduction in the gold melting point due to the gold being in nanoparticle form, typical II-VI semiconductor nanowire MOVPE growth temperatures are ~550° C. This temperature is significantly above the preferred growth temperature (270-340° C.) of crystalline II-VI semiconductors, such as, ZnSe. As a result, the ensuing II-VI semiconductor nanowires contain large numbers of undesirable native defects, which impacts both the quality of the emission (for undoped nanowires) and the ability to modulate the doping of the nanowires. Using MBE the growth temperature of ZnSe nanowires by VLS has been lowered to the low 300° C. range; however, the morphology of the resultant nanowires has been average at best (Y. Ohno et al., Appl. Phys. Lett. 87, 043105 (2005); A. Colli et al., Appl. Phys. Lett. 86, 153103 (2005)).

An important aspect for growing II-VI semiconductor nanowires with reduced native defects is to engineer the metal catalysts such that the nanowires can be grown at the preferred growth temperatures (270-340° C.). The engineered metal catalysts must be such that they act as preferred growth sites for the II-VI semiconductor materials, and, secondly, the metal atoms don't diffuse into the II-VI semiconductor nanowires during the growth sequence and form unwanted impurities (which impact the emission or ability to dope the nanowires). Finally, the metal catalysts should be non-toxic. Given all of these constraints, possible choices are metal alloys of Au (since Au acts as an excellent catalyst site), such as, Au—In, Au—Ga, Au—Sn, and Au—Pb. Thin Au—In films were formed by sequential thermal evaporation of gold, followed by indium. Upon flowing Zn and Se precursors via MOVPE at a Zn:Se ratio of ~1:3.6 (found to be ideal for forming high quality epitaxial crystalline films) and heating the substrate to a temperature of 330° C., it was found that nanowire arrays can be formed. Photoluminescence of the nanowires (at 77° K) revealed two sets of peaks, one associated with bandgap region emission and the other associated with n-type substitutional dopants. As a result of those results, Au—Ga catalysts were determined to be an equally unattractive choice. Next the column IV elements of Sn and Pb were considered. Both have low melting points and form alloys with Au in all proportions. In addition, both are not known to be dopants in II-VI materials. Lead alloys were not tried due to their known toxicity. In the example section below, results are given to show that high quality II-VI core-shell semiconductor nanowires can be formed using Au—Sn catalysts in MOVPE-based VLS growth. Photoluminescence at 77° K reveals bandgap excitonic features and the absence of sub-bandgap defect emission (indicating that native defects are not formed and that the Sn did not dope the nanowires).

FIGS. 2a and 2b illustrate the semiconductor nanowires of the present invention. Referring to FIG. 2a, the II-VI core semiconductor nanowires 220 can either be grown directly on a support 200 or on the surface of a low energy surface film 210. The support 200 can be any material structure which can withstand the MOVPE growth temperatures (up to ~400° C. for the shell materials). Correspondingly, glass, semiconductor substrates, such as Si or GaAs, metal foils, and high temperature plastics can be used as supports. The optional low energy surface film 210 is deposited on the support 200 in order to enhance the selectivity of the core nanowire growth. As is well known in the art, typical low energy surface films 210 are oxides, such as, silicon oxide and aluminum oxide. They can be deposited by processes well known in the art, such as, sputtering, atomic layer deposition (ALD), and chemical vapor deposition. In cases where the support 200 is silicon and the low energy surface film 210 is silicon oxide, the silicon oxide can also be formed by wet or dry thermal oxide processes. FIG. 2a shows that each II-VI core semiconductor nanowire 220 is attached to the support 200 (or the optional low energy surface film 210) at one end. The free end of each II-VI core semiconductor nanowire 220 is terminated in a metal alloy nanoparticle 230. As discussed above the metal alloy nanoparticle 230 should: 1) have a reduced melting point of ~330° C. and less; 2) enable localized growth of the nanowires; 3) not dope the nanowires; and 4) be non-toxic. Au—Sn metallic alloys were found to meet all of these criteria. Even though Au—Sn alloys are reported in this disclosure, other metal alloy nanoparticle 230 candidates are equally valid as long as they meet the four criteria discussed above. It should also be noted that in certain applications the toxicity constraint could be relaxed.

Referring to FIG. 2b, large enhancements in the quantum efficiencies of II-VI core-shell semiconductor nanowires 215 can be obtained by forming II-VI semiconductor shell(s) 240 surrounding the II-VI core semiconductor nanowires 220. The figure illustrates the case where the semiconductor shell 240 is composed of two distinct material compositions, for example, ZnSeS for the inner shell and ZnS for the outer shell. The invented II-VI core-shell semiconductor nanowires 215 are such that the semiconductor shells 240 can be either singular (one material composition) or multiple (two or greater). The thickness of each of the semiconductor shells 240 can range from 1-2 nm to hundreds of nanometers, with the preferred thickness range being 1 to 20 nm. Furthermore, each shell section can be either uniform or graded (from $ZnSe_{0.5}S_{0.5}$ to $ZnSe_{0.25}S_{0.75}$, for example) in material composition. As is well known in the art, the goal of shelling is to remove the surface states from the core region of the nanowires where radiative recombination, as well as transport, of the electrons and holes occurs. The semiconductor shells 240 need to be crystalline and typically are constructed such that both the electrons and holes are confined to the core nanowire region. As such, the number and material composition of the semiconductor shells 240 are mainly dictated by these two criteria. Nonetheless, as is well known in the art, there are cases where electron and hole recombination occurs in different regions of the nanowires. For example in certain Type II semiconductor nanowires, the holes in the core recombine with the electrons in the shell nearest the core (e.g., ZnTe core and ZnSe inner shell). In other cases the material compositions are chosen such that electron and hole recombination occurs in one of the shells. In that case, as is well known in the art, the II-VI semiconductor shell 240 in which recombination occurs is typically chosen such that its width is less than the exciton radius of the electron-hole pair (and thus the shell is a quantum well). In general, the II-VI semiconductor shells 240 of the present invention can be simple binary compounds, such as, ZnS or MgS, more complex ternary compounds, such as, ZnSeS or ZnMgTe, or quaternary compounds, such as, ZnMgSSe or ZnMgSeTe.

By the same token, the II-VI core semiconductor nanowires 220 of the present invention can be simple binary compounds, such as, ZnSe or CdTe, more complex ternary compounds, such as, ZnSeS or CdZnSe, or quaternary compounds, such as, CdZnSSe or CdZnSeTe. In some cases the material composition of the II-VI core semiconductor nanowire 220 will be uniform along its length; in others the material composition will be varied either smoothly or discretely along its length, using MOVPE growth techniques that are well known in the art. Referring to FIG. 3, II-VI core-shell semiconductor nanowires 215 are illustrated in which the II-VI core semiconductor nanowires 220 contain discrete heterostructure units 222. In some cases the discrete heterostructure units 222 will be uniform in composition, in others the material content (II-VI binary, ternary, or quaternary compositions) will smoothly vary from one composition to another, such as, from $ZnSe_{0.5}S_{0.5}$ to ZnS. Each of the discrete heterostructure units 222 can be composed of the same composition (in which case the II-VI core semiconductor nanowire 220 will have a uniform composition) or they can vary, as is well known in the art, in order to produce nanowires with specific properties. The discrete heterostructure units 222 can vary in number from 1 (in which case the II-VI core semiconductor nanowire 220 will have a uniform composition) to hundreds, as is well known in the art. The lengths of the discrete heterostructure units 222 can vary from many microns down to quantum well dimensions of 1 to 10 nm. In general the discrete heterostructure units 222 can vary in both length and in composition along the extent of the II-VI core semiconductor nanowires 220 in order to produce II-VI core semiconductor nanowires 220 with desired physical attributes. The overall lengths of the II-VI core-shell semiconductor nanowires 215 can range from 500 nm to tens of microns, with the preferred length range being 2 to 10 microns. With regard to the thicknesses of the II-VI core-shell semiconductor nanowires 215, they are typically less than 500 nm, with a preferred thickness being less than 100 nm. With regard to II-VI core semiconductor nanowires 220 with very small thicknesses, 10 nm thick nanowires can be made routinely by methods well known in the art. Sub 10 nm thick nanowires are more difficult to produce since they require equally small metal alloy nanoparticles 230.

FIG. 4 illustrates II-VI core-shell semiconductor nanowires 215 where dopants 224 are included in either some of the discrete heterostructure units 222, some of the shell(s), or both in order to modify the conductivity or spectral response of the nanowires. As is well known in the art, dopants 224 that modulate the conductivity can be either n-type or p-type. For II-VI materials, some of the demonstrated n-type dopants 224 are Al, In, Ga, Cl, Br, and I. The highest n-type doping levels are typically obtained with the column VII elements substituting for the chalcogens, for example, Cl substituting for Se in ZnSe. An effective dopant 224 for MOVPE applications is Cl since precursors, such as, butyl chloride, are easy to use, readily available, and doping levels in the $10^{18}$ cm$^{-3}$ range can be obtained. With regard to p-type dopants 224, column I or column V elements have been successfully implemented for II-VI materials. Representative column I elements are Li and Cu, while representative column V elements are N, P, and As. In addition to these elements, LiN has been demonstrated to be an effective p-type dopant 224 for II-VI materials. As discussed above, some dopants 224 strongly modify the spectral response of the host semiconductor. For example, as is well known in the art, Mn and Cu can be used to obtain broad green-red and blue-green emission, respectively, when ZnSe is the host material (N. Pradhan et al., JACS 129, 3339 (2007)). As illustrated in FIG. 4, the dopant concentration and types can differ between the various discrete heterostructure units 222 and II-VI semiconductor shell(s) 240. More specifically, each discrete heterostructure unit 222 or II-VI semiconductor shell(s) 240 can have a different dopant 224 species, type (n-type, p-type, or emissive), and concentration, with some discrete heterostructure units 222 or II-VI semiconductor shell(s) 240 being nominally undoped. Overall the distribution of dopants is selected, as is well known in the art, to obtain specific properties for the II-VI core-shell semiconductor nanowires 215.

With regard to forming the II-VI core-shell semiconductor nanowires 215, the following processes can be used to make core-shell nanowires in accordance with the present invention. Variations from the following procedures are also incorporated as part of this disclosure if they are natural variations well known to those practiced in the art. To begin the support 200 needs to be chosen. As discussed above the support 200 can be any material structure which can withstand the MOVPE growth temperatures (up to ~400° C. for the shell materials). Correspondingly, glass, semiconductor substrates, such as Si or GaAs, metal foils, and high temperature plastics are possible supports 200. For particular supports 200, such as, Si or GaAs, it can be desirable to enhance the selectivity of the nanowire growth by forming a low energy surface film 210 on the surface of the support 200. The low energy surface film 210 can be deposited by processes, such as, sputtering, CVD, ALD, or electron-beam evaporation. Typical low energy surface films 210 are silicon oxide and aluminum oxide. In cases where the support 200 is silicon and the low energy surface film 210 is silicon oxide, the silicon oxide can also be formed by wet or dry thermal oxide processes. Appropriate cleaning procedures are followed prior to depositing the low energy surface films 210. Next metal alloy nanoparticles 230 need to be formed on the surface of the support 200 or low energy surface film 210. The metal alloy nanoparticles 230 can be formed by two different methods. In one instance dispersions of metal alloy nanoparticles 230 can be formed, followed by deposition of the dispersion on the surface of the support 200 or low energy surface film 210. For this case, the metal alloy nanoparticles 230 can be synthesized by wet chemistry processes, as are well known in the art. Given the difficulty in forming colloidal metal nanoparticles containing more than one metallic element, it is preferred to deposit thin metal films containing the metals of interest, since very thin metal layers (<5 nm) typically deposit in discrete nano-islands instead of continuous films. Conventional deposition processes can be used, such as, thermal evaporation, sputtering, and e-beam evaporation to form the metallic films. The two or more metals including the metal alloy nanoparticles 230 can be deposited either consecutively or simultaneously. In addition, following the metal deposition, sometimes it is beneficial to heat the support in order to aid in the formation of metal alloy nanoparticles 230 having particular sizes. The preferred metal alloy nanoparticles 230 are gold-tin alloys, where the preferred volume ratio of gold to tin ranges from 1:5 to 5:1. Other metal alloys can be used instead of Au—Sn as long as they meet the four criteria discussed above. As is well known in the art, standard cleaning procedures are to be followed prior to forming the metal alloy nanoparticles 230 on the surface of the support 200 or the low energy surface film 210.

Next the support 200 containing the optional low energy surface film 210 and the metal alloy nanoparticles 230 is placed in a II-VI growth chamber in order to grow the II-VI core-shell semiconductor nanowires 215 by the VLS process. The growth can occur either by MBE or MOVPE, with MOVPE being the preferred process due to the lower manufacturing costs associated with MOVPE growth processes. As is well known in the art, sometimes it is desirable to precondition the growth surface prior to growing the nanowires. For example, hydrogen can be flowed at 0.5-2 liters/minute for 10 to 20 minutes, with the support 200 at a temperature of 300 to 500° C. As stated above, the preferred growth temperature for II-VI materials is between 270 and 340° C. Thus, prior to the growth of the core nanowires 220, the support is heated to between 270 and 340° C. As is well known in the art, MOVPE growth can take place at sub-atmospheric pressures. Accordingly, it is preferred that the core-shell semiconductor nanowires 215 be grown at MOVPE reactor pressures ranging from 50 ton to 760 ton. Appropriate combinations of II-VI semiconductor precursors are selectively flowed (in addition to the main carrier gas) in order to form the discrete heterostructure units 222 including the II-VI core semiconductor nanowires 220. As is well known in the VLS art, the metal alloy nanoparticles 230 act as catalysts during the core nanowire growth and as a result cause localized growth of the II-VI core semiconductor nanowires 220 at the positions of the metal alloy nanoparticles 230. With regard to the low energy surface film 210, its purpose is to enhance the selectivity of the II-VI core semiconductor nanowire 220 growth. More particularly, ideal core nanowire growth occurs when semiconductor growth only takes place at the positions of the metal alloy nanoparticles 230. As is well known in the art, semiconductor precursors want to grow on high energy surfaces in order to reduce the total energy of the system. Accordingly, when the precursors impinge on the low energy surface film 210, it is energetically favorable for them to diffuse to the positions of the metal catalysts where they collect inside of the catalysts at high concentrations. Once the concentration of precursors is beyond the solubility limit of the metal catalysts, they start forming the core semiconductor nanowires 220 from the bottom side of the catalysts (and thus initially on the growth surface). The II-VI core semiconductor nanowires 220 increase in length as a result of additional growth just below the metal catalysts, which remain on top of the semiconductor nanowires 220 as shown in FIG. 2.

Following the growth of the II-VI core semiconductor nanowires 220, the deposition conditions are modified to engender non-localized growth of the semiconductor material. This results in forming semiconductor shells 240 surrounding the II-VI core semiconductor nanowires 220. As is well known in the art, typical techniques for turning off selective growth is to modify the growth temperature or switching to different combinations of precursors. With the II-VI core semiconductor nanowires 220 growth taking place at temperatures between 270 and 340° C., it was found that one approach for producing high quality II-VI core-shell semiconductor nanowires 215 was to raise the growth temperature to between 350 and 390° C. (while maintaining the same set of precursors). Quite unexpectedly, another way for switching to non-localized growth was discovered which permitted both the set of precursors and the temperature to remain the same as that used when growing the core nanowires. More specifically by increasing the growth rate, the nanowire growth could be switched from localized growth to non-localized growth. Taking the example of ZnSe/ZnSeS core/shell nanowires, the growth rate is simply controlled by varying the flow rate of the Zn precursor (while correspondingly scaling the Se and S precursor rates). The advantage of this approach is that the growth temperature can be maintained in the low 300° C. range for the entire nanowire growth sequence, thus minimizing the creation of unwanted defects. One possible explanation for the impact of growth rate on the growth selectivity is that under slow growth conditions the precursors have time to diffuse from the bare support surface to the positions of the metal catalysts, while at higher growth rates, there is an excess of column II and column VI precursors on the surface that enable semiconductor film formation to occur at many locations on the support surface. As is well known in the art, when non-selective growth occurs, semiconductor film formation occurs on all heated surfaces, and thus on all sides of the nanowires in addition to film formation on the support 200 (or optional low energy surface film 210). As shown in FIGS. 2-4, semiconductor shell 240 formation occurs both on the sides and top (underneath the metal alloy nanoparticles 230) of the II-VI core semiconductor nanowires 220.

Typical II-VI semiconductor precursors include diethylzinc, dimethyl cadmium, bis(methyl-$\eta^5$-cyclopentadienyl) magnesium, tert-butyl selenide, tert-butyl sulfide, and di-isopropyl telluride, which are used to form the elements of Zn, Cd, Mg, Se, S, and Te. As is well known in the art, many II-VI semiconductor precursors have been tried over the years. The previous list includes those precursors which have been found to be reactive at the growth temperatures between 270 and 340° C. To perform the shelling at temperatures between 310 and 390° C., the same group of precursors can be used. However, as is well known in the art, a different set of precursors can be chosen for the shell formation in order to obtain shells with specific material compositions or grown at specific temperatures. For many II-VI compounds the preferred molar ratio of semiconductor precursors impinging on the growth surface ranges from 1:1 to 1:4 of column II precursors to column VI precursors, respectively. It has been found that employing these ranges of molar ratios for both the core and shell growths results in the formation of high quality II-VI core-shell semiconductor nanowires 215.

As discussed above, the II-VI core semiconductor nanowires 220 are composed of discrete heterostructure units 222 that vary in composition, thickness, and doping (type and concentration). Standard MOVPE growth procedures are followed to grow each discrete heterostructure unit 222, whereby the semiconductor and dopant precursors are selectively chosen and switched in order to get the proper composition, thickness, and doping. By the same token, the semiconductor shell(s) 240 can also vary in composition, thickness, and doping (type and concentration). Standard MOVPE growth procedures are followed to grow each semiconductor shell 240, whereby the semiconductor and dopant precursors are selectively chosen and switched in order to get the proper composition, thickness, and doping. With regard to the dopant precursors, again it is desirable that they be chosen such that they are reactive at the growth temperatures between 270 and 390° C. For example, appropriate Cl, N, and P precursors are butyl chloride, tert-butyl amine, and tri-n-butylphosphine; however, as is well known in the art, other precursors can be chosen. With regard to the composition of either the discrete heterostructure units 222 or the semiconductor shell(s) 240, they can be either uniform or compositionally graded from one end to the other. In addition, they can be composed of binary, ternary, or quaternary II-VI semiconductor compounds. Some representative binary compounds are ZnSe, CdTe, and ZnS; some representative ternary compounds are ZnSeTe, CdZnSe, and ZnSeS; and some representative quaternary compounds are ZnMgSeS and CdZnSeTe. As is well known in the art, in order to obtain ternary or quaternary compounds in the cores, shells, or both, at least two column II precursors, or two column VI precursors, or both need to be flowed in the MOVPE growth chamber.

The following examples are presented as further understandings of the present invention and are not to be construed as limitations thereon.

Example 1

In this example a comparison is made between the photoluminescence responses of unshelled ZnSe nanowires and shelled ZnSe nanowires, where the shelling material is ZnSeS. Both types of nanowires are formed on Si substrates, where a low energy surface film 210 of silicon oxide is on the surface of the Si. To begin the process the Si substrates are degreased in a sonicator using consecutively acetone, methanol, and water. Next the Si substrates are placed in a conventional dry thermal oxide furnace where 1 micron of oxide is formed on the surface. To form metal alloy nanoparticles 230 of gold-tin the substrates are placed in a conventional thermal evaporator whose base pressure goes down to ~$10^{-6}$ torr. Prior to thermal evaporation the substrates are degreased in a sonicator using consecutively acetone, methanol, and water. To form the gold-tin nanoparticles, 1 nm of gold is thermally evaporated, followed by 3 nm of tin.

Growth of the nanowires occurs in a home-built atmospheric pressure horizontal MOVPE apparatus. Prior to loading the nanoparticle-covered Si samples into the water-cooled (4° C.) glass reactor chamber, the samples are degreased consecutively in acetone, methanol, and water (no sonication). The Zn, Se, and S precursors are diethylzinc, tert-butyl selenide, and tert-butyl sulfide respectively. The carrier gas is He—H$_2$ (8% hydrogen), which flows at a rate of 1700 sccm. The ratio of Zn to chalcogen precursors impinging on the samples is set to 1:3.6. For the unshelled ZnSe nanowires, the substrates are heated to 320° C. during the core growth, which occurs for 60 minutes by flowing 2.5 and 13.8 sccm of He—H$_2$ through the Zn and Se bubblers, respectively. For the core-shell ZnSe/ZnSeS nanowires, the ZnSe core nanowire growth conditions are the same as that for the unshelled case, except the growth time is 55 minutes. For the shelling step (substrate at 370° C.) two uniform ZnSeS shells are grown, one at a 35% molar ratio of S to Se for 12 minutes, the other at a 55% molar ratio of S to Se for 17 minutes. The molar ratios correspond to that of the Se and S precursors (the actual S incorporation in the nanowires is much less due to nonlinearities in the ZnSeS growth process). More specifically, for the 35% ZnSeS shell, the Zn, Se, and S precursor flow rates are 2.5, 8.9, and 8.2, respectively, while for the 55% ZnSeS shell, the Zn, Se, and S precursor flow rates are 2.5, 6.2, and 12.9, respectively. The main carrier gas of He—H$_2$ flows at a rate of 1600 sccm. The overall length of both sets of nanowires is on the order of 3-4 microns.

Figures 5A, 5B:
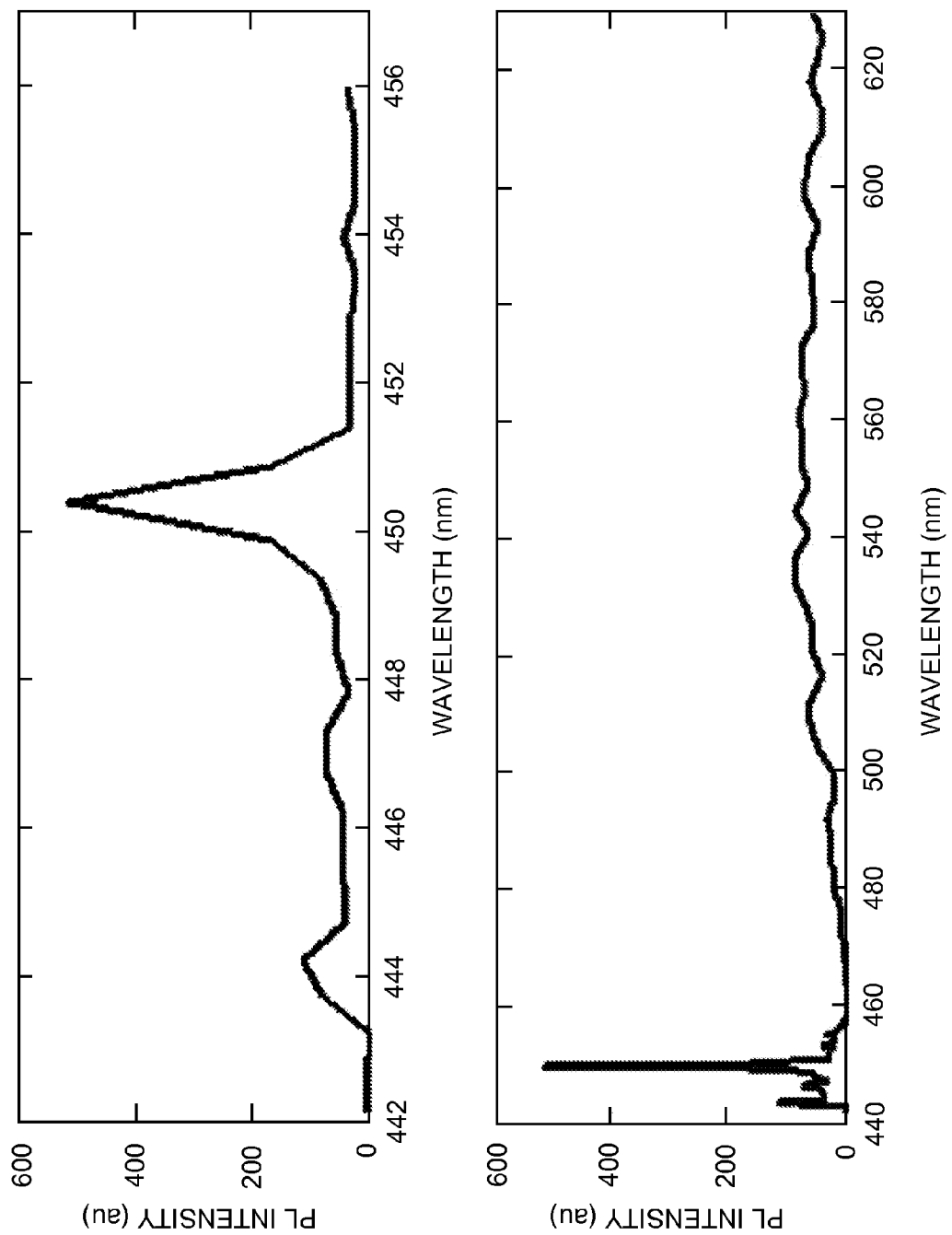
FIGS. 5a and 5b show the photoluminescence intensity of an array of unshelled ZnSe nanowires.
Figures 6A, 6B:
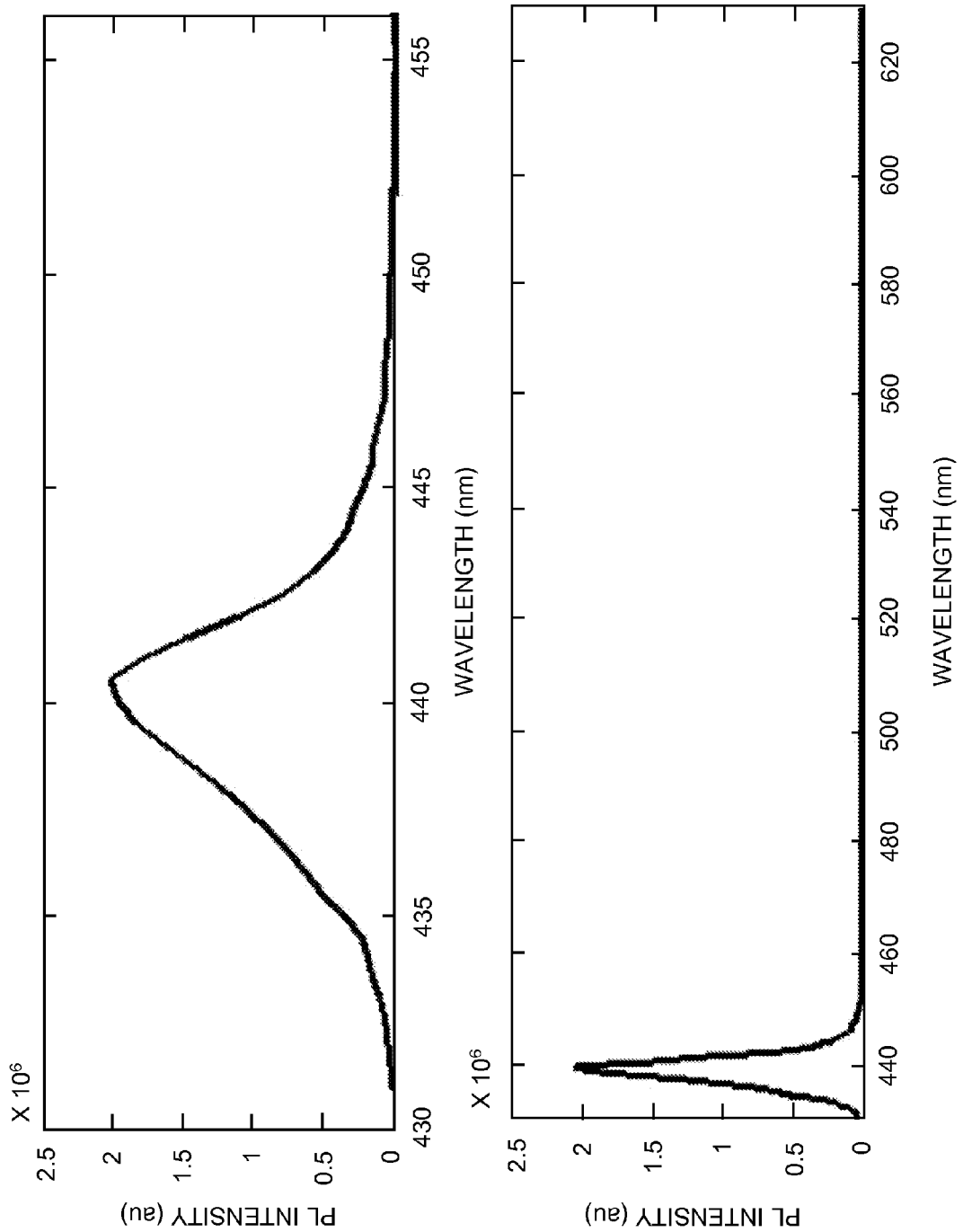
FIGS. 6a and 6b show the photoluminescence intensity of an array of ZnSe/ZnSeS core-shell nanowires.

Low temperature (77° K) photoluminescence results are given in FIGS. 5 and 6 for the unshelled and shelled nanowires, respectively. The pump beam is the 10 mW continuous output from a Nichia 405 nm laser diode which is focused to a spot size of ~0.5 mm. The emission is detected by a Jobin-Yvon double monochrometer. FIGS. 5a and 6a show details of the bandgap exciton region, while FIGS. 5b and 6b show the entire spectra. FIG. 5a shows exciton features at ~444.3 and 450.5 nm. The latter feature corresponds to bulk ZnSe exciton emission due to the ZnSe nanowires emitting in the direction parallel to the long dimension of the nanowires. The shorter wavelength nanowire emission at 444.3 nm is due to the nanowires emitting in the perpendicular direction, and thus, quantum confined by the sides of the nanowires. Since the ZnSe nanowire diameters are on the order of 25-40 nm, the degree of quantum confinement is small. The sub-bandgap defect emission present (beyond 470 nm) in the spectra of FIG. 5b is due to traps at the surfaces of the nanowires since the ZnSe nanowires are not shelled or covered with passivating organic ligands. FIG. 5 shows that for unshelled ZnSe, the peak to defect emission ratio is 10:1, which is very good for unshelled ZnSe nanowires grown under stoichiometric conditions. FIG. 6 shows that the impact of shelling with ZnSeS is to greatly increase the bandgap exciton feature, while minimizing the sub-bandgap defect emission. More specifically, FIG. 6 shows that the bulk ZnSe emission feature at 450.5 nm disappears, the quantized ZnSe emission feature at 444.3 nm blue shifts to ~440 nm and increases by over 4 orders of magnitude, and the peak (440 nm) to defect (500 nm) ratio increases by 3 orders of magnitude. The blue shift is due to the greater quantum confinement resulting from the inclusion of ZnSeS shells; while the disappearance of the bulk ZnSe feature occurs since quantum confined states have a shorter radiative lifetime than bulk states as a result of the Purcell effect. The very large increases in the bandgap exciton feature and the peak to defect ratio occur since shelling with ZnSeS enables the transfer of defect-causing surface states from the core surface region to the outer shell surface region. It should also be noted that there is an absence of the Y-line defect at around 485 nm which is typically present in bulk ZnSe with internal defects. Overall the two figures indicate that highly crystalline core-shell ZnSe/ZnSeS nanowires are formed with minimal amounts of internal defects.

Example 2

In this example ZnSe/ZnSeS core-shell nanowires are grown where the core ZnSe nanowire is doped with Cl. The growth conditions are analogous to that described in Example 1 for the core-shell nanowires except for the following. The chlorine precursor is butyl chloride. Because small amounts of Cl is required to dope ZnSe highly n-type, the butyl chloride bubbler was cooled to a temperature of −25 C. For the ZnSe:Cl core nanowire growth, 2.8, 15.4 and 0.4 sccm of He—H$_2$ flows through the Zn, Se, and Cl bubblers, respectively, for 65 minutes. Once more there are two ZnSeS shells (35% and 55%). For the 35% ZnSeS shell, 2.8, 10.0, and 9.2 sccm of He—H$_2$ flows through the Zn, Se, and S bubblers, respectively, for 13 minutes. For the 55% ZnSeS shell, 2.8, 6.9, and 14.4 sccm of He—H$_2$ flows through the Zn, Se, and S bubblers, respectively, for 20 minutes.

Figure 8A:
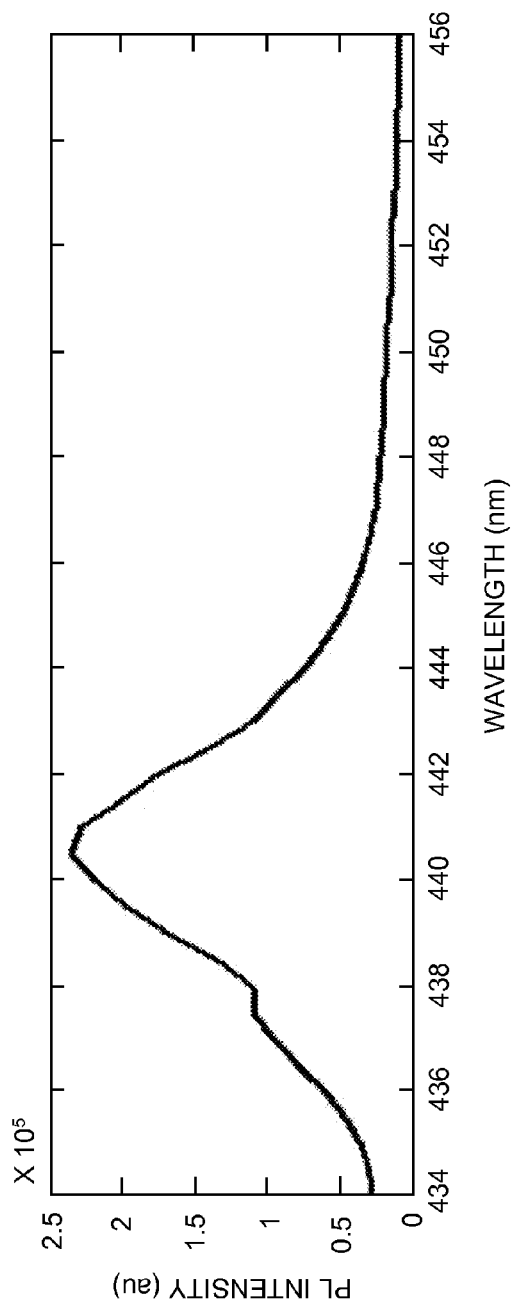
FIGS. 8a and 8b show the photoluminescence intensity of an array of ZnSe:Cl/ZnSeS core-shell nanowires.
Figure 8B:
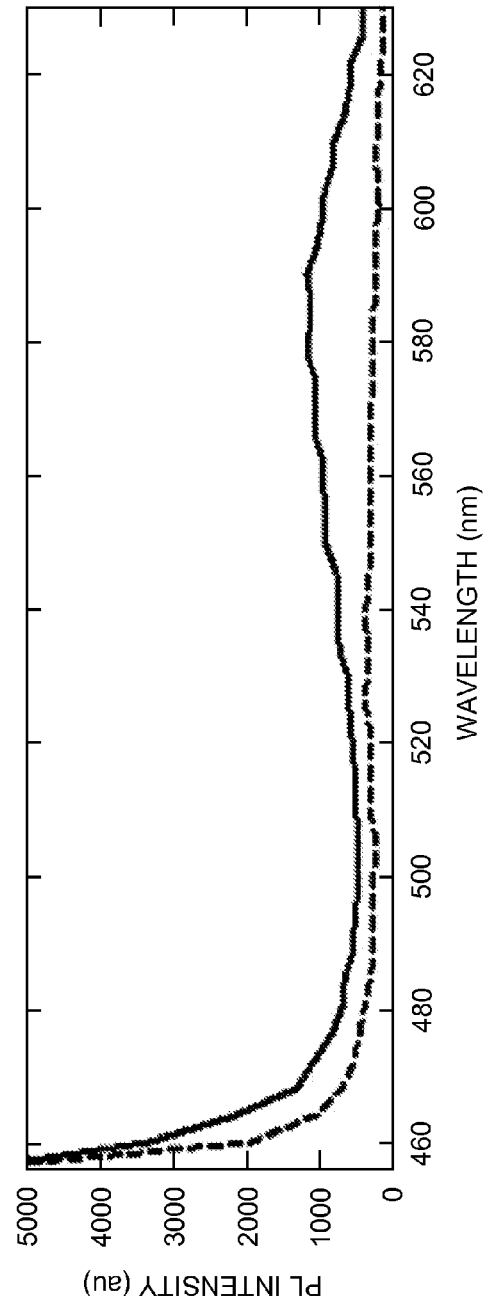

FIG. 7 shows representative scanning electron microscope (SEM) images of isolated ZnSe:Cl/ZnSeS core-shell nanowires at two different magnifications. FIG. 7a shows that a long (8.8 μm) core-shell nanowire is formed which has good thickness uniformity along its length. FIG. 7b reveals that the core-shell nanowire thickness is 52.2 nm. Low temperature (77° K) photoluminescence results are given in FIG. 8 for the Cl-doped core-shell nanowires. FIG. 8a show details of the bandgap exciton region, while FIG. 8b shows the sub-bandgap region. Comparing the photoluminescence traces of FIGS. 6 and 8 shows that the impact of Cl doping is to broaden and weaken the bandgap exciton emission at 440 nm while introducing a broad Cl-induced defect peak centered at 585 nm. To aid in comparing with the undoped core-shell nanowire result from FIG. 6, FIG. 8b includes its spectra (dashed line). The position of the Cl-induced defect peak is very similar to that obtained when growing bulk epitaxial ZnSe films doped with Cl. To determine the impact of the Cl-doping on the electrical conductivity of the core-shell nanowires, the following procedure is performed. Very briefly, SU8 is spun cast on as-grown arrays of the core-shell nanowires in order to partially submerge the nanowires in SU8. After appropriate curing the wires are briefly placed in an oxygen plasma to remove any SU8 from the unsubmerged tops of the nanowires. Next 100 nm of In (for ohmic contact formation) followed by thick Ag is thermally evaporated on to the bare nanowires sticking out of the SU8. The entire array is then detached from the Si substrate, enabling patterned metal (In and Ag) to be thermally evaporated on the bottom side of the nanowire array encased in SU8. IV measurements are then performed to determine the electrical resistance of collections of nanowires (the patterned metal areas are ~0.04 mm$^2$). Measurements are performed on both doped and undoped ZnSe/ZnSeS core-shell nanowires. For the undoped nanowire arrays the extracted resistance is on the order of 50 Gohms, while for the Cl-doped core-shell nanowires the extracted resistance is ~2 Kohms, lower by over 7 orders of magnitude. The very high resistance of the undoped core-shell nanowires indicates that the core ZnSe nanowires are intrinsic (as occurs for good quality ZnSe epi material) and lack native defects which would result in unwanted doping of the nanowires. Also these results provide another verification of the very high quality of the undoped ZnSe/ZnSeS core-shell nanowires. In addition, the doping results (both photoluminescence and electrical resistance) parallel the trends occurring for bulk epi-films of ZnSe, indicating that ZnSe nanowires can be controllably doped n-type with Cl.

Example 3

In the final example multiple quantum wells of ZnSeTe are grown in the core ZnSe nanowires, which once again are shelled with ZnSeS (35% followed by 55%). In order to increase the flow rate of carrier gas through the Zn bubbler, it is cooled to a temperature of −13° C. (enabling a factor of 10 increase in the flow rate). For this example the Au/Sn nanoparticles are formed by thermally evaporating 1.5 nm of Au followed by 4.5 nm of Sn. The Te precursor is diisopropyl telluride. Its bubbler is cooled to −18° C. For the ZnSe:ZnSeTe core nanowire growth, 7.7, 7.8 and 30 sccm of He—$H_2$ flows through the Zn, Se, and Te bubblers, respectively. It is to be noted that the Te precursor flow is indicative of approximately an 8% Te concentration in ZnSeTe. The main He—$H_2$ carrier gas flows at 1700 sccm, while the substrate is maintained at 330° C. Starting with the growth of ZnSe for 420 s, the ZnSeTe quantum wells are grown for 5 s, followed by 145 s of a ZnSe barrier section. This sequence (quantum well and barrier section) is then repeated until the core nanowire growth ended after 65 minutes. It is to be noted that what is being modulated is the Te precursor flow (at 30 sccm for the quantum wells, and 0 sccm for the barrier sections). For the ZnSeS shells the substrate remains at 330° C., while the growth rate is increased in order to switch to delocalized growth. More specifically, for the 35% ZnSeS shell, 15.0, 7.4, and 6.8 sccm of He—$H_2$ flows through the Zn, Se, and S bubblers, respectively, for 12 minutes. For the 55% ZnSeS shell, 15.0, 5.7, and 9.7 sccm of He—$H_2$ flows through the Zn, Se, and S bubblers, respectively, for 17 minutes. The main He—$H_2$ carrier gas flows at 1600 sccm.

Figure 9A:
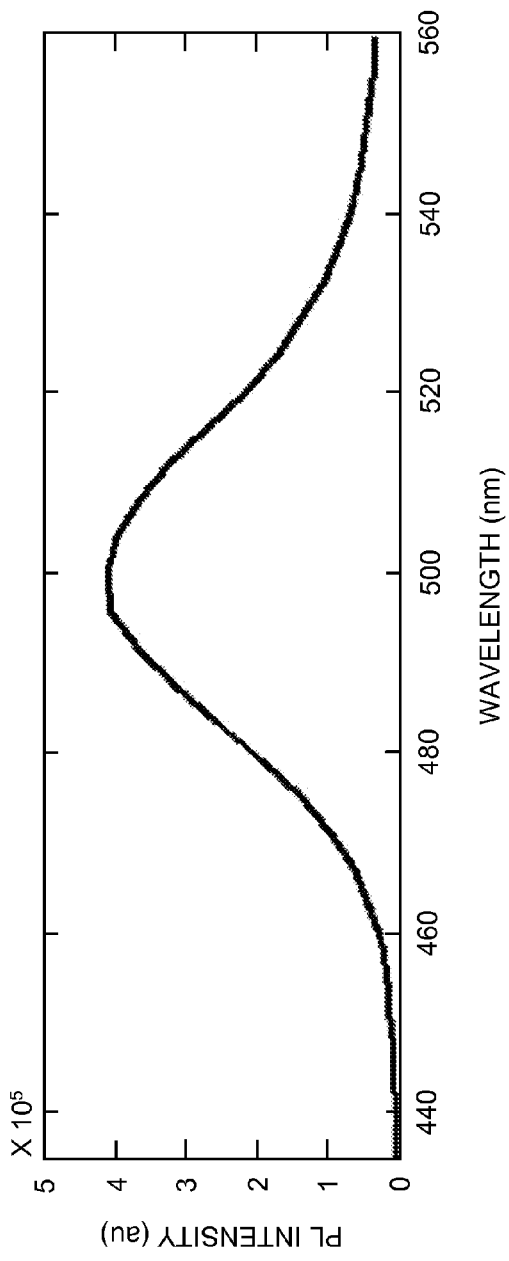
FIGS. 9a and 9b show the photoluminescence intensity of an array of ZnSe/ZnSeS core-shell nanowires where the core nanowires contain multiple quantum wells of ZnSeTe.
Figure 9B:
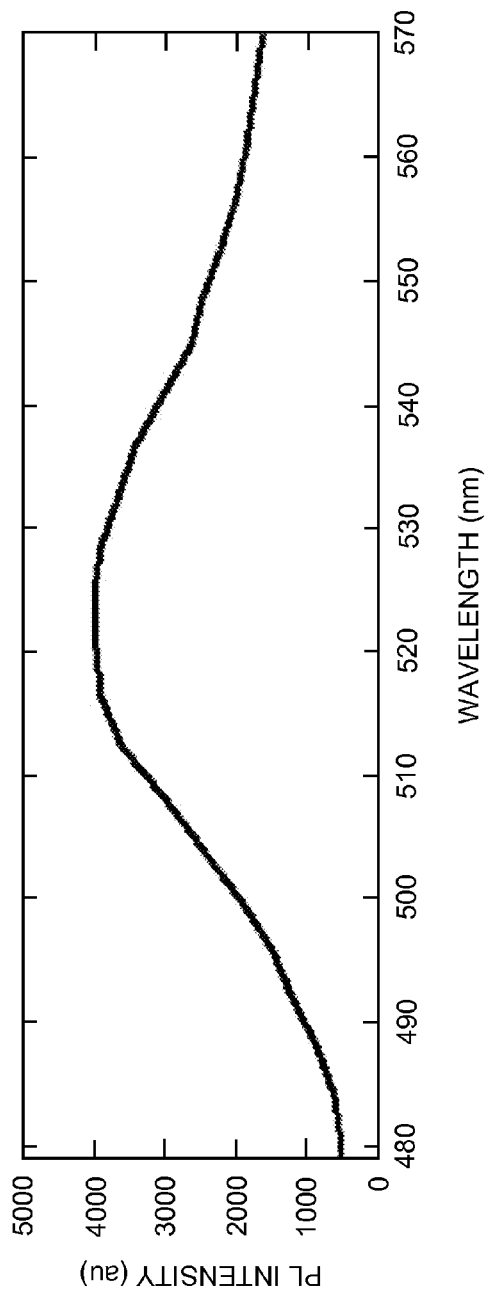

FIG. 9 shows the 77 K (a) and 300 K (b) photoluminescence from the ZnSe:ZnSeTe/ZnSeS core-shell nanowire arrays. FIG. 9a reveals that all of the excited electron-hole pairs recombine in the ZnSeTe quantum wells since the ZnSe bandgap exciton emission at 440 nm is gone. Comparisons between the highest intensity ZnSe/ZnSeS core-shell nanowire arrays with and without ZnSeTe quantum wells indicate that the integrated photoluminescence is highest for the quantum well samples. This result is to be expected since the added quantum wells will increase the confinement of the carriers, resulting in faster recombination times (and better able to compete with non-radiative recombination events). FIG. 9b shows the impact of measurement temperature (from 77 K to 300 K) on the photoluminescence intensity, resulting in a drop in integrated intensity of approximately a factor of 70, a red shift (~20 nm) in the peak intensity, and a broadening (from ~40 nm FWHM to ~50 nm FWHM) of the photoluminescence response. As is well known in the art, all of these effects are to be expected. The drop-off in the photoluminescence intensity from 77 K to 300K can be accounted for by two effects: 1) The core nanowire region of ZnSeTe—ZnSe multiple quantum wells is a type II semiconductor, resulting in poor overlap of the electrons and holes; and 2) With the quantum wells being $ZnSe_{0.92}Te_{0.08}$ and the barriers being ZnSe, the offset between them results in a small potential barrier for the electrons and holes. Overall, the results of FIG. 9 reveal that high quality multiple quantum wells can be successfully incorporated into core-shell ZnSe/ZnSeS nanowires.

In summary, all three examples show that high quality II-VI core-shell semiconductor nanowires can be grown at low temperatures using atmospheric pressure MOVPE and metal-alloy nanoparticles as the catalysts.

The invention has been described in detail with particular reference to certain preferred embodiments thereof, but it will be understood that variations and modifications can be effected within the spirit and scope of the invention.

PARTS LIST 100 substrate
110 semiconductor nanowire
120 metal nanoparticle
200 support
210 low energy surface film
215 II-VI core-shell semiconductor nanowire
220 II-VI core semiconductor nanowire
222 discrete heterostructure unit
224 dopants
230 metal alloy nanoparticle
240 semiconductor shell

The invention claimed is:

1. A method of making II-VI core-shell semiconductor nanowires, comprising:
   (a) providing a support;
   (b) depositing a layer including metal alloy nanoparticles on the support;
   (c) heating the support and flowing II-VI semiconductor precursors to selectively provide localized growth of II-VI core semiconductor nanowires wherein the metal alloy nanoparticles act as catalysts; and
   (d) modifying the growth conditions and shelling the core nanowires to form II-VI core-shell semiconductor nanowires by flowing II-VI semiconductor precursors to impinge upon the core semiconductor nanowires and obtain non-selective growth.

2. The method of claim 1 wherein the support is selected to withstand II-VI metal-organic vapor phase epitaxy growth temperatures.

3. The method of claim 2 wherein the support includes glasses, semiconductor substrates, metal foils, or high temperature plastics.

4. The method of claim 1 further including depositing a low energy surface film on the support.

5. The method of claim 4 wherein the low energy surface film includes silicon oxide or aluminum oxide.

6. The method of claim 1 wherein the metal alloy is gold-tin.

7. The method of claim 6 wherein the volume ratio of gold to tin ranges from 1:5 to 5:1.

8. The method of claim 6 wherein step (b) includes thermal evaporation or sputtering of gold and tin.

9. The method of claim 1 wherein the II-VI semiconductor precursors include diethylzinc, dimethyl cadmium, tert-butyl selenide, tert-butyl sulfide, di-isopropyl telluride, or bis(methyl-$\eta^5$-cyclopentadienyl)magnesium.

10. The method of claim 1 wherein step (c) the support is heated between 270° C. and 340° C.

11. The method of claim 1 wherein step (d) the growth conditions are modified by adjusting the precursor flow rates and heating the support to between 270° C. and 340° C.

12. The method of claim 1 wherein step (d) the growth conditions are modified by heating the support to between 350° C. and 390° C.

13. The method of claim 1 wherein the core-shell semiconductor nanowire growth takes place at a pressure between 50 torr and 760 torr.

14. The method of claim 1 wherein step (c) the molar ratio of column VI precursors to column II precursors is in a range from 1:1 to 4:1.

15. The method of claim 1 wherein step (c) further includes at least two column II precursors or at least two column VI precursors or both.

16. The method of claim 1 wherein step (d) the molar ratio of column VI precursors to column II precursors is in a range from 1:1 to 4:1.

17. The method of claim 1 wherein step (d) further includes at least two column II precursors or at least two column VI precursors or both.

18. The method of claim 1 wherein the diameter of each core-shell nanowire is less than 500 nanometers.

19. The method of claim 18 wherein the diameter of each core-shell nanowire is less than 100 nanometers.

20. The method of claim 1 wherein the length of each core-shell nanowire is greater than 500 nanometers.

21. The method of claim 20 wherein the length of each core-shell nanowire is greater than 2 microns.

22. The method of claim 1 wherein step (c) further includes forming the core of each nanowire to include one or more discrete heterostructure units whose II-VI material composition is either uniform or varies over its length.

23. The method of claim 22 includes sequentially delivering II-VI semiconductor precursors to cause these materials to deposit and grow the cores containing one or more discrete heterostructure units.

24. The method of claim 22 wherein the discrete heterostructure units have lengths which range from 1-10 nm to microns.

25. The method of claim 1 wherein dopants are provided in step (c) or (d) or both which modify the conductivity of the core-shell nanowires.

26. The method of claim 1 wherein dopants are provided in step (c) or (d) or both which modify the spectral response of the core-shell nanowires.

27. The method of claim 26 wherein the dopants are selected from Mn or Cu.

28. The method of claim 1 wherein the shell includes a plurality of layers.

29. The method of claim 1 wherein the shell thickness ranges from 1 nanometer to hundreds of nanometers.

30. The method of claim 1 wherein the shell is either uniform or varies over its diameter.

* * * * *